United States Patent
Kim et al.

(10) Patent No.: US 8,760,900 B2
(45) Date of Patent: Jun. 24, 2014

(54) CONTENT ADDRESSABLE MEMORY

(71) Applicants: Young Seog Kim, Pleasanton, CA (US); Kuoyuan Hsu, San Jose, CA (US); Jacklyn Chang, San Ramon, CA (US)

(72) Inventors: Young Seog Kim, Pleasanton, CA (US); Kuoyuan Hsu, San Jose, CA (US); Jacklyn Chang, San Ramon, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/770,436

(22) Filed: Feb. 19, 2013

(65) Prior Publication Data
US 2013/0155749 A1    Jun. 20, 2013

Related U.S. Application Data

(63) Continuation of application No. 12/788,924, filed on May 27, 2010, now Pat. No. 8,395,920.

(60) Provisional application No. 61/221,877, filed on Jun. 30, 2009.

(51) Int. Cl.
*G11C 15/00* (2006.01)
*G11C 15/04* (2006.01)

(52) U.S. Cl.
CPC ..................... *G11C 15/04* (2013.01)
USPC ............... 365/49.1; 365/189.07; 365/189.08; 365/49.17; 365/49.18

(58) Field of Classification Search
CPC ......... G11C 15/04; G11C 15/00; G11C 27/02
USPC .................. 365/49.01, 49.17, 189.16, 189.07
See application file for complete search history.

(56) References Cited

U.S. PATENT DOCUMENTS

| | | | |
|---|---|---|---|
| 5,964,857 A | 10/1999 | Srinivasan et al. | |
| 2005/0063241 A1* | 3/2005 | Pereira et al. | 365/222 |

* cited by examiner

*Primary Examiner* — Thong Q Le
(74) *Attorney, Agent, or Firm* — Lowe Hauptman & Ham, LLP

(57) ABSTRACT

A memory includes a plurality of content-addressable memory (CAM) cells and a summary circuit associated with the plurality of CAM cells. The summary circuit includes a first level of logic gates and a second level of logic gates. The first level of logic gates have inputs each configured to receive an output of a corresponding one of the plurality of CAM cell. The second level of logic gates have inputs each configured to receive an output of a corresponding one of the first level of logic gates.

20 Claims, 14 Drawing Sheets

US 8,760,900 B2

CONTENT ADDRESSABLE MEMORY

CROSS-REFERENCE TO RELATED APPLICATIONS

The present application is a continuation of U.S. application Ser. No. 12/788,924, filed May 27, 2010, and issued Mar. 12, 2013, as U.S. Pat. No. 8,395,920, which claims priority of U.S. Provisional Patent Application No. 61/221,877 filed Jun. 30, 2009, which are incorporated herein by reference in their entireties.

TECHNICAL FIELD

The present disclosure generally relates to CAM (Content-Addressable Memory).

BACKGROUND

Generally, a CAM is designed such that a user supplies a data bus (e.g., lookup data) comprising various data lines and the CAM searches a table with entries to determine if all data lines of the data bus match all compared lines of the entry related to the data bus in the table. If all data lines match all compared lines of the entry then there is a "hit," and the CAM returns the address of the matched entry. If any one of the data lines does not match any one of the compared lines, then it is a "miss," and the CAM does not return any address. Various CAM cell design approaches include a match line and transistors each associated with a compared line. If all data lines are hit, the match line stays at its original level (e.g., high). If, however, there is a miss in any of the data lines, the transistor associated with the miss line discharges the match line, e.g., pulling it toward ground. Since there is discharging, there is also charging. Because discharging and charging the match line is dynamic, those CAMs are commonly referred to as dynamic CAMs. Dynamic CAMs are usually slow, can produce noise, cause timing problems at high frequency and/or require additional circuitry for asynchronous applications. Many dynamic CAMs also require clocking circuitry for the match pre-charge, compare operations, data lookups, etc. Lookup data and match line pre-charge require high power, and a match line of dynamic CAMs can cause current leakages, sensing difficult, and weak capacitive coupling with a neighboring match line, etc.

BRIEF DESCRIPTION OF THE DRAWINGS

The details of one or more embodiments of the disclosure are set forth in the accompanying drawings and the description below. Other features and advantages of the disclosure will be apparent from the description, drawings, and claims.

Like reference symbols in the various drawings indicate like elements.

DETAILED DESCRIPTION

Figure 1:
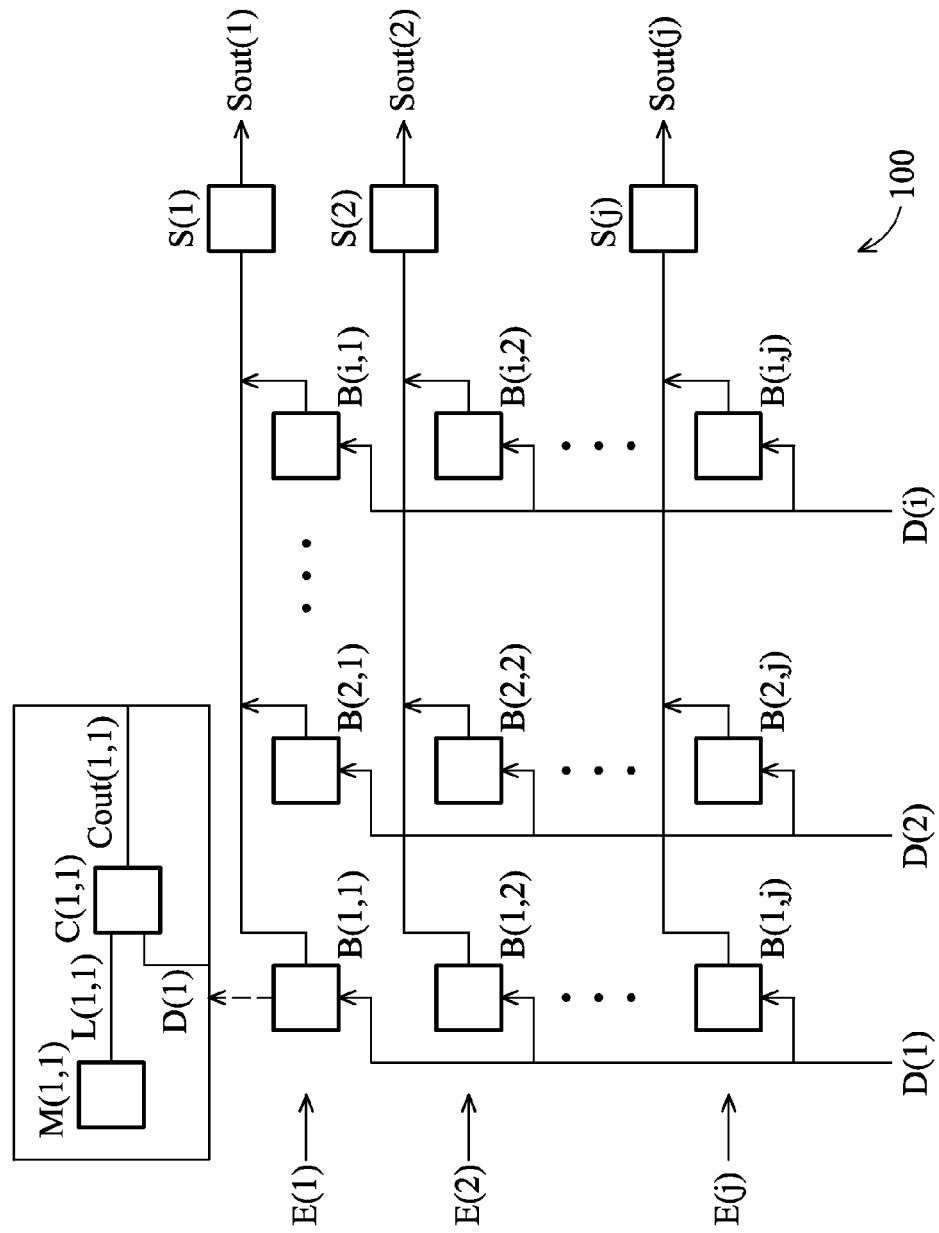
FIG. 1 shows a CAM in accordance with an embodiment of the disclosure.

Various embodiments, or examples, of the disclosure illustrated in the drawings are now described using specific language. It will nevertheless be understood that no limitation of the scope of the invention is thereby intended. Any alterations and modifications in the described embodiments, and any further applications of principles of the disclosure described in this document are contemplated as would normally occur to one skilled in the art to which the disclosure relates. Reference numbers may be repeated throughout the embodiments, but this does not necessarily require that feature(s) of one embodiment apply to another embodiment, even if they share the same reference number.

Content Addressable Memory

FIG. 1 shows a CAM 100 in accordance with an embodiment of the disclosure. For illustration purposes, circuit 100 includes j entries E each including i number of CAM cells B. Each CAM cell B is associated with a memory cell M and a comparator C. For simplicity, detail of only CAM cell B(1,1) is shown, but other CAM cells B include similar components as those of CAM cell B(1,1). The output Cout of a comparator C also serves as an output of a CAM cell B.

Depending on implementation, a memory cell M in a CAM cell B could be different types of memory, including, for example, an SRAM (static Random Access memory), a DRAM (dynamic RAM), a flash RAM, a PRAM (phase RAM), an RRAM (register RAM), etc.

CAM 100 receives as input a number i of lookup data lines (e.g., lines D1 to D(i)), which may be referred to as a data bus. Each data line D associated with an entry E is associated with a CAM cell B. When data on the data lines (e.g., data lines D(1) to D(i)) is received comparators C compare data in memory cells M to the received data D. For an example related to entry E(1), each comparator C(1,1) to C(i,1) compares the corresponding data in memory cells M(1,1) to M(i,1) to the received data D(1) to D(i). For an example with respect to CAM cell B(1,1), comparator C(1,1) compares the data in memory cell M(1,1) to data D(1). In an embodiment, if the data in memory cell M(1,1) is the same as data D(1) then comparator C(1,1) returns a hit (e.g., high) on line Cout(1,1), and if the data in memory cell M(1,1) differs from data D(1) then comparator C(1,1) returns a miss (e.g., a low) on line Cout(1,1). With respect to CAM cell B(2,1), comparator C(2, 1) compares the data in memory cell M(2,1) to data D(2). If the data in memory cell M(2,1) is the same as data D(2) then comparator C(2,1) returns a hit on line Cout(2,1), and if the data in memory cell M(2,1) differs from data D(2), then comparator C(2,1) returns a miss on line Cout(2,1). With respect to CAM cell B(i,1), comparator C(i,1) compares the data in memory cell M(i,1) to data D(i). If the data in memory cell M(i,1) is the same as data D(i) then comparator C(i,1) returns a hit on line Cout(i,1), and if the data in memory cell M(i,1) differs from data D(i) then comparator C(i,1) returns a miss on line Cout(i,1), etc. If all data in memory cells M(1,1) to M(i,1) is the same as data D(1) to D(i) associated with an entry E (e.g., entry E(1)) then there is a hit associated with that entry E(1). For example, if there is a hit in all CAM cells B(1,1) to B(i,1) (e.g., all lines Cout(1,1) to Cout(i,1) are hit), then summary S(1) returns a hit (e.g., low) on line Sout(1). If there is any miss (e.g., any low) in any CAM cell B(1,1) to CAM cell B(i,1), then summary S(1) returns a miss (e.g., high) on line Sout(1). Depending on implementations, CAM 100 returns an address if there is one or more hit entries.

Those skilled in the art will recognize that a summary S (e.g., summary S(1)) functions as a NAND gate because summary S(1) returns a low when all of its inputs are high and returns a high when at least one of its inputs is low. The above example is for illustration purposes only, a summary S may be implemented using various other compatible circuits, such as an AND, an OR, a NOR, and equivalences thereof. Further, those skilled in the art will also recognize that the output of an AND is an inverse of that of a NAND (e.g., an AND is a NAND with an inverter at the output of the NAND and vice versa). Additionally, summary S (e.g., summary S(1)) is implemented as a NAND to function with the active logic high at the output Cout of comparators C. That is, if there is hit, then Cout is high. If the logic level at Cout, however, is active low then a NOR may be implemented. For example, if all data at Cout(1,1) to C(i,1) is low (e.g., there is a hit), then Sout(1) is high, but if any one of Cout(1,1) to C(i,1) is high, then Sout(1) is low. Similarly to the NAND situation, an OR may be implemented in place of a NOR by adding an inverter at the output of the NOR gate. The above illustration related to entry E(1) is for illustration purposes only. The operation of other entries (e.g., entries E(2) to entry E(j)) is similar to that of entry E(1).

Summary Circuit for Cam

Transistor Level

Figure 2:
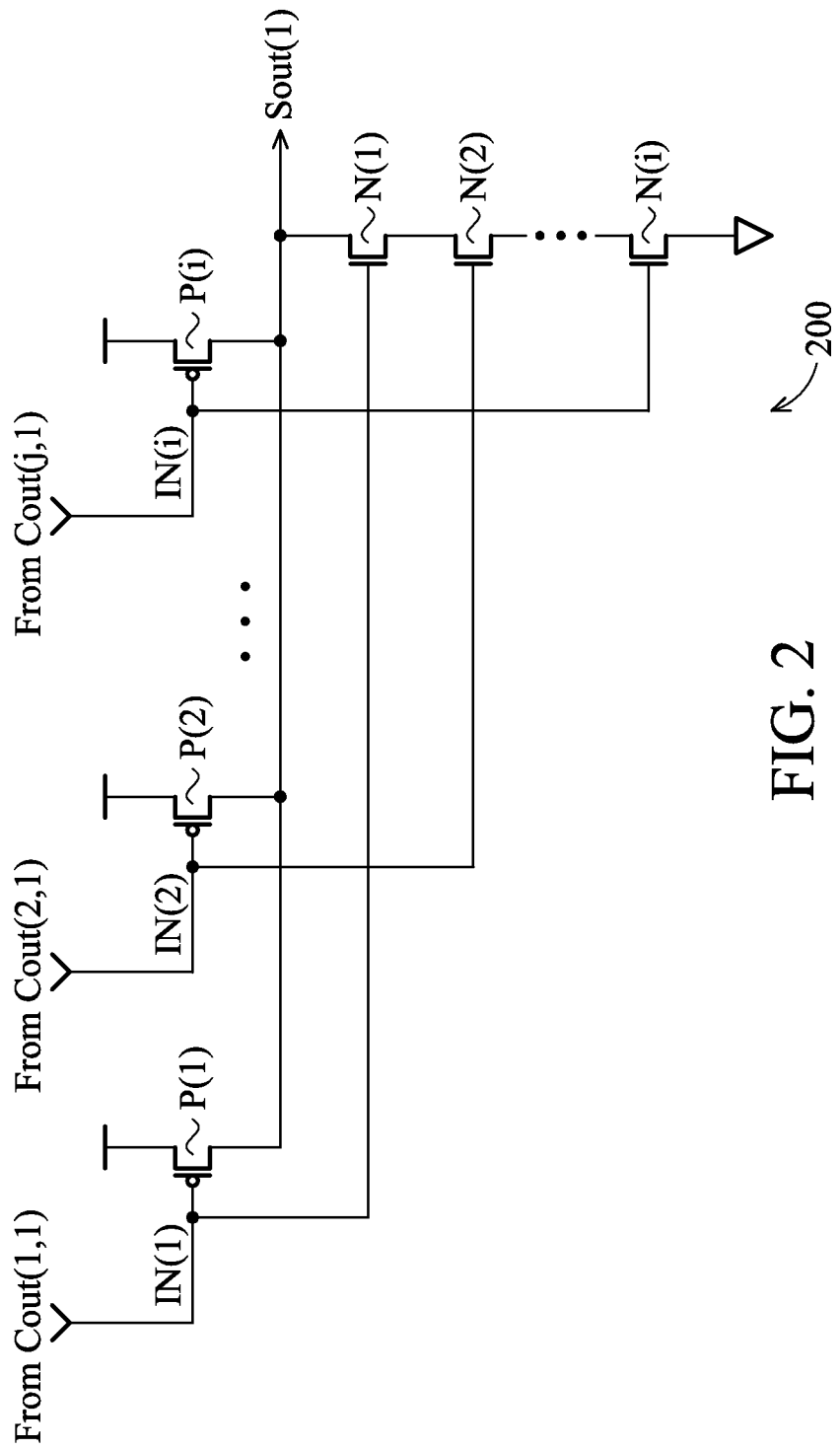
FIG. 2 shows a summary of the CAM in FIG. 1 implemented at the transistor level as a NAND gate in accordance with an embodiment.

FIG. 2 shows a circuit 200 illustrating an embodiment of a summary S, e.g., summary S(1), implemented in the transistor level as a NAND gate. Each input IN(1) to IN(i) corresponds to a pair of transistors P and N (e.g., transistors P(1) and N(1) to P(i) and N(i)), and receives a corresponding output of comparator C in FIG. 1 (e.g., output of comparator Cout(1,1) to Cout(i,1)). Output NANDout corresponds to an output Sout of FIG. 1 (e.g., Sout(1)).

Figure 3:
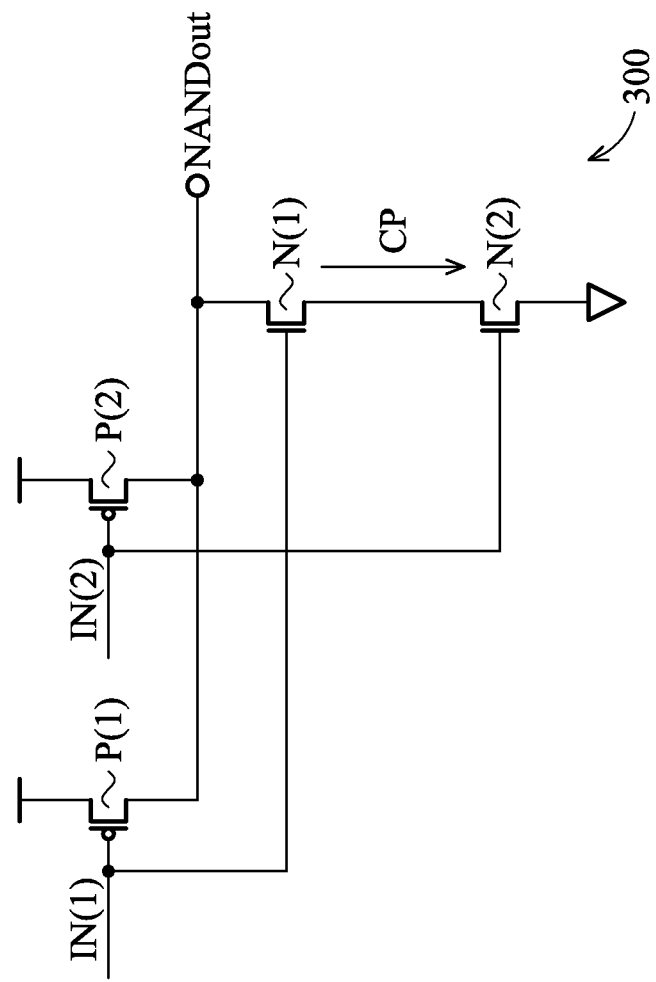
FIG. 3 shows the summary of FIG. 2 having only two inputs for illustration purposes.

For illustration purposes, circuit 200 is explained in the context of a two input NAND gate shown as circuit 300 in FIG. 3. If both inputs IN(1) and IN(2) are low then both transistors P(1) and P(2) are on and both transistors N(1) and N(2) are off. Because both transistors N(1) and N(2) are off, there is no current flowing through current path CP, and output NANDout is therefore high through Vdd of both transistors P(1) and P(2). If input IN(1) is low and input IN(2) is high, then transistor P(1) is on and transistor N(1) is off, and transistor P(2) is off and transistor N(2) is on. Because transistor N(1) is off, there is no current flowing through current path CP, and output NANDout is therefore high through Vdd of transistor P(1). If input IN(2) is low and input IN(1) is high, then transistor P(2) is on and transistor N(2) is off, and transistor P(1) is off and transistor N(1) is on. Because transistor N(2) is off, there is no current flowing through current path CP, and output NANDout is therefore high through Vdd of transistor P(2). If both inputs IN(1) and IN(2) are high then both transistors P(1) and P(2) are off and both transistors N(1) and N(2) are on. Because both transistors P(1) and P(2) are off, output NANDout is low through ground of transistor N(2). Output NANDout, going through an inverter known in the art, will provide an AND function.

Figure 4:
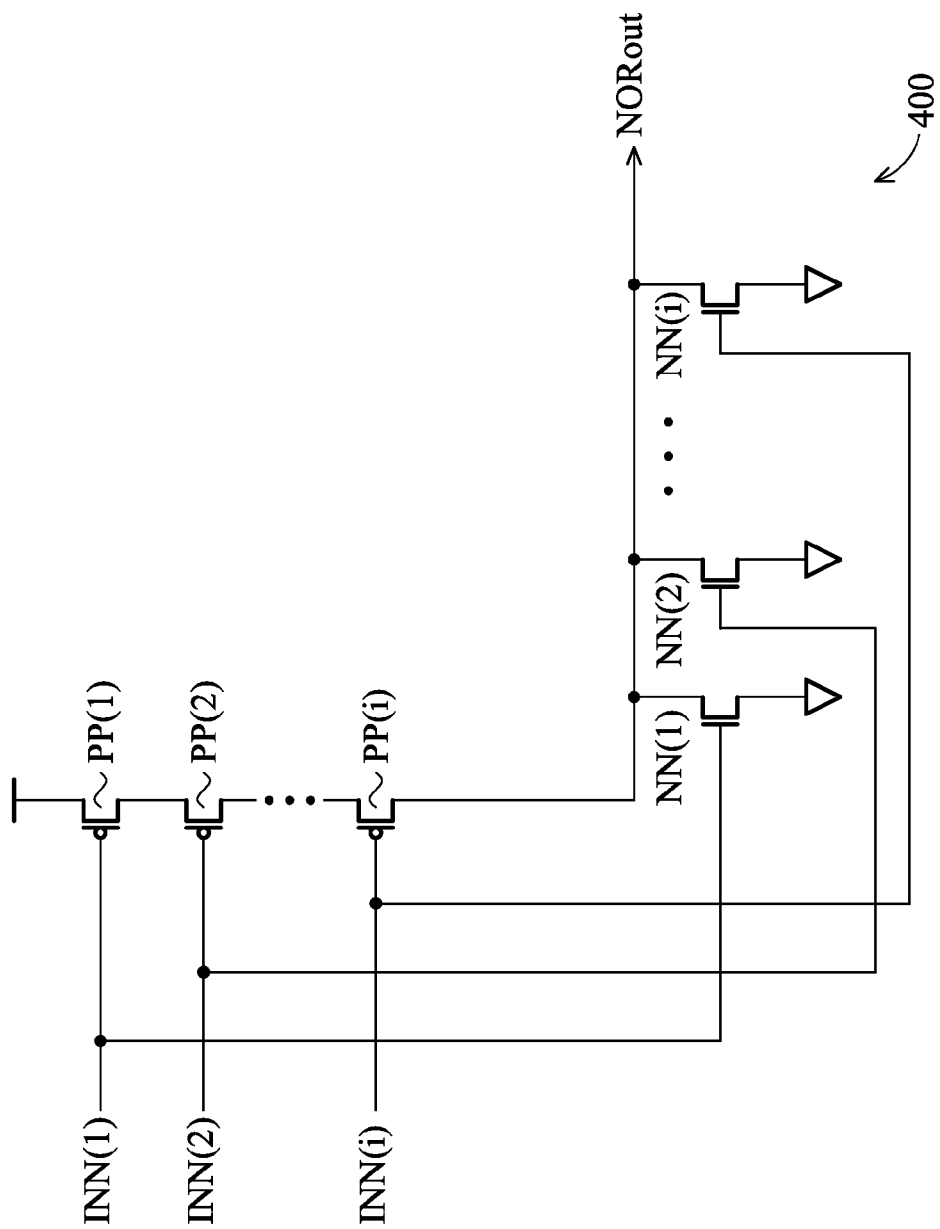
FIG. 4 shows a summary of the CAM in FIG. 1 implemented at the transistor level as a NOR gate in accordance with an embodiment.

FIG. 4 shows a circuit 400 illustrating an embodiment of a summary S, e.g., summary S(1), implemented in the transistor level as a NOR gate. Each input INN(1) to INN(i) corresponds to a pair of transistors PP and PN (e.g., transistors PP(1) and NN(1) to PP(i) and NN(i)), and receives a corresponding output of comparator C in FIG. 1 (e.g., comparator Cout(1,1) to Cout(i,1)). Output NORout corresponds to an output Sout of FIG. 1 (e.g., Sout(1)).

Figure 5:
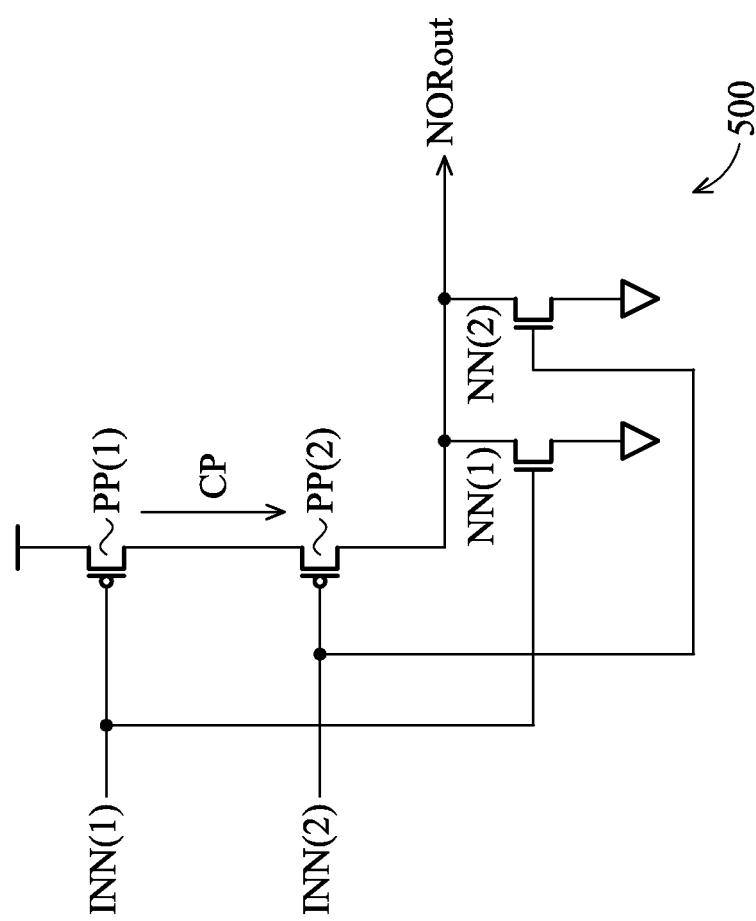
FIG. 5 shows the summary of FIG. 4 having only two inputs for illustration purposes.

For illustration purposes, circuit 400 is explained in the context of a two input NOR gate shown in FIG. 5. If both inputs INN(1) and INN(2) are low then both transistors PP(1) and PP(2) are on and both transistors NN(1) and NN(2) are off. Because both transistors PP(1) and PP(2) are on, current flows through current path CP, and output NORout is therefore high through Vdd of transistor PP(1). If input INN(1) is low and input INN(2) is high, then transistor PP(1) is on and transistor NN(1) is off, and transistor PP(2) is off and transistor NN(1) is on. Because transistor PP(1) is off, there is no current flowing through current path CP, and output NORout is therefore low through ground of transistor INN(1) and INN(2). If input INN(2) is low and input INN(1) is high, then transistor PP(2) is on and transistor NN(2) is off, and transistor PP(1) is off and transistor NN(1) is on. Because transistor PP(1) is off, there is no current flowing through current path CP, and output NORout is therefore low. If both inputs NN(1) and NN(2) are high then both transistors PP(1) and PP(2) are off and both transistors NN(1) and NN(2) are on. Because both transistors PP(1) and PP(2) are off, output NORout is therefore low. Output NORout, going through an inverter known in the art, will provide an OR function.

Summary Circuit for Cam

Combinatorial Circuits

Figure 6:
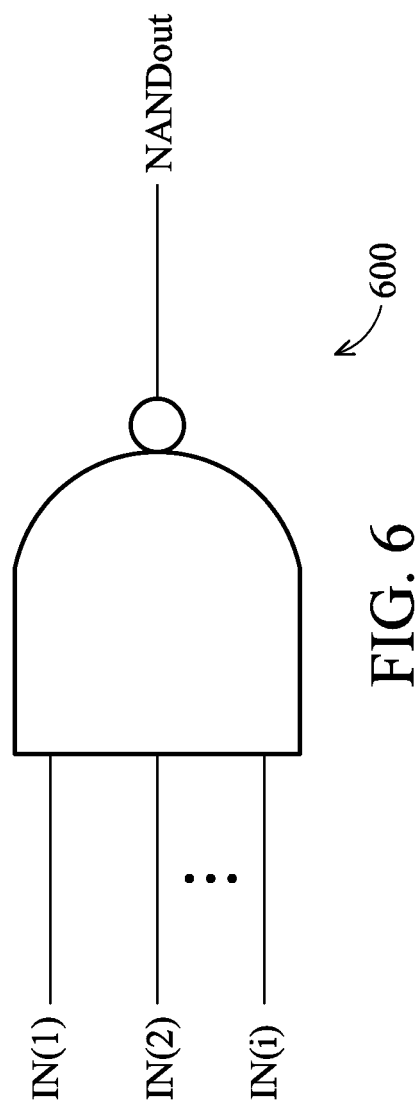
FIG. 6 shows a summary of the CAM in FIG. 1 as a NAND gate in accordance with an embodiment.

FIG. 6 shows an embodiment of a Summary S (e.g., summary S(1)) implemented as a NAND gate 600. NAND gate 600 includes i number of inputs IN(1) to IN(i) and an output NANDout. NAND gate 600 corresponds to circuit 200 in the transistor level.

In various embodiments of the disclosure, a data bus D received by CAM 100 can be quite large, i.e., there is a large number of data lines D(1) to D(i) or, alternatively expressed, index i is large, and there is a large number of lines Cout to be input into a summary S (e.g., summary S(1)). Depending on applications, embodiments of the disclosure use equivalent circuits to provide the function of NAND gate 600 or 200.

Figure 7:
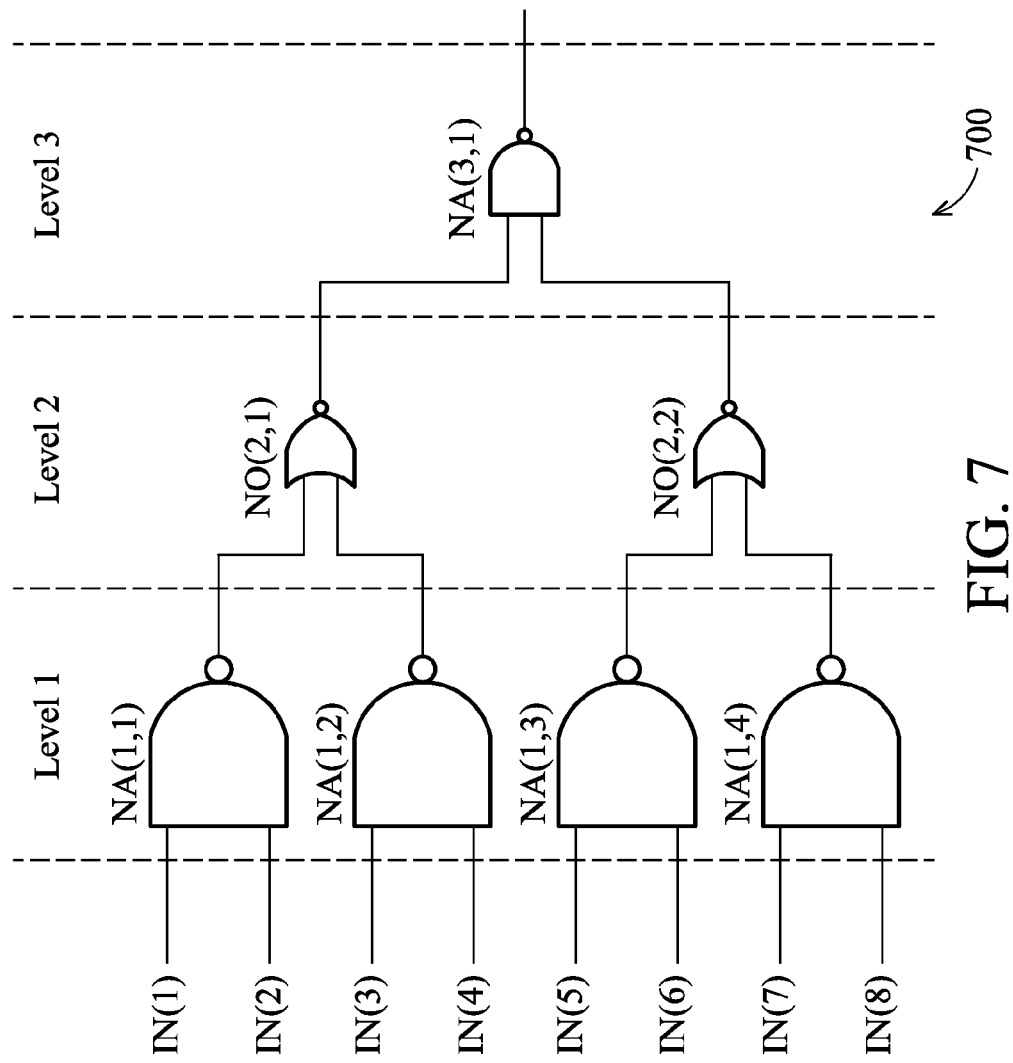
FIG. 7 shows the summary in FIG. 6 implemented in different levels of combinatorial circuitry in accordance with an embodiment having eight inputs.

FIG. 7 shows an embodiment of summary S(1) implemented as circuit 700 functioning as NAND gate 600. For illustration purposes, circuit 700 includes eight inputs (i.e., index i equals to eight). Circuit 700 includes a first level of four 2-input NAND gates, e.g., NAND gates NA(1,1), NA(1, 2), NA(1,3), and NA(1,4), a second level of two 2-input NOR gates NOR (2,1) and NOR (2,2), and a third level of one 2-input NAND gate NA(3,1). Those skilled in the art will recognize that circuit 700 functions the same as circuit 600 having 8 inputs, the detail of which is not described here.

In various embodiments of the disclosure, if the number of data lines D increases, then the index i increases, and there are therefore additional inputs to a summary S. As a result, additional NAND gates (e.g., NAND gates NA(1, 5), NA(1, 6), etc.), at level one may be added to adapt to such increase. If such NAND gates are added, then NOR gates (e.g., NO(2,1), NO(2,2), etc.) at level two may receive additional inputs. For example, in FIG. 7, each of NOR gates NO(2,1), NO(2,2) receives two inputs from NAND gates in level one (NA(1,1), NA(1,2), NA(1,3), NA(1,4)), if additional NAND gates N(1, 5), NAND N(1, 6), etc., are added, then each NOR gates NO(2,1), NO(2,2) may be modified to receive two, three or more inputs. The number of inputs each NOR gate NO(2,1), NO(2,2) may receive depending on the number of NAND gates at level one that are added. Alternatively, additional NOR gates at level two (e.g., NOR gate NO(2,3), NO(2,4), etc.) may be added to adapt to the number of added NAND gates at level one. When the number of outputs of NOR gate (e.g., NO(2,1), NO(2,2)) increases, NAND gate NA(3,1) at level three may be modified to receive additional inputs.

Figure 8:
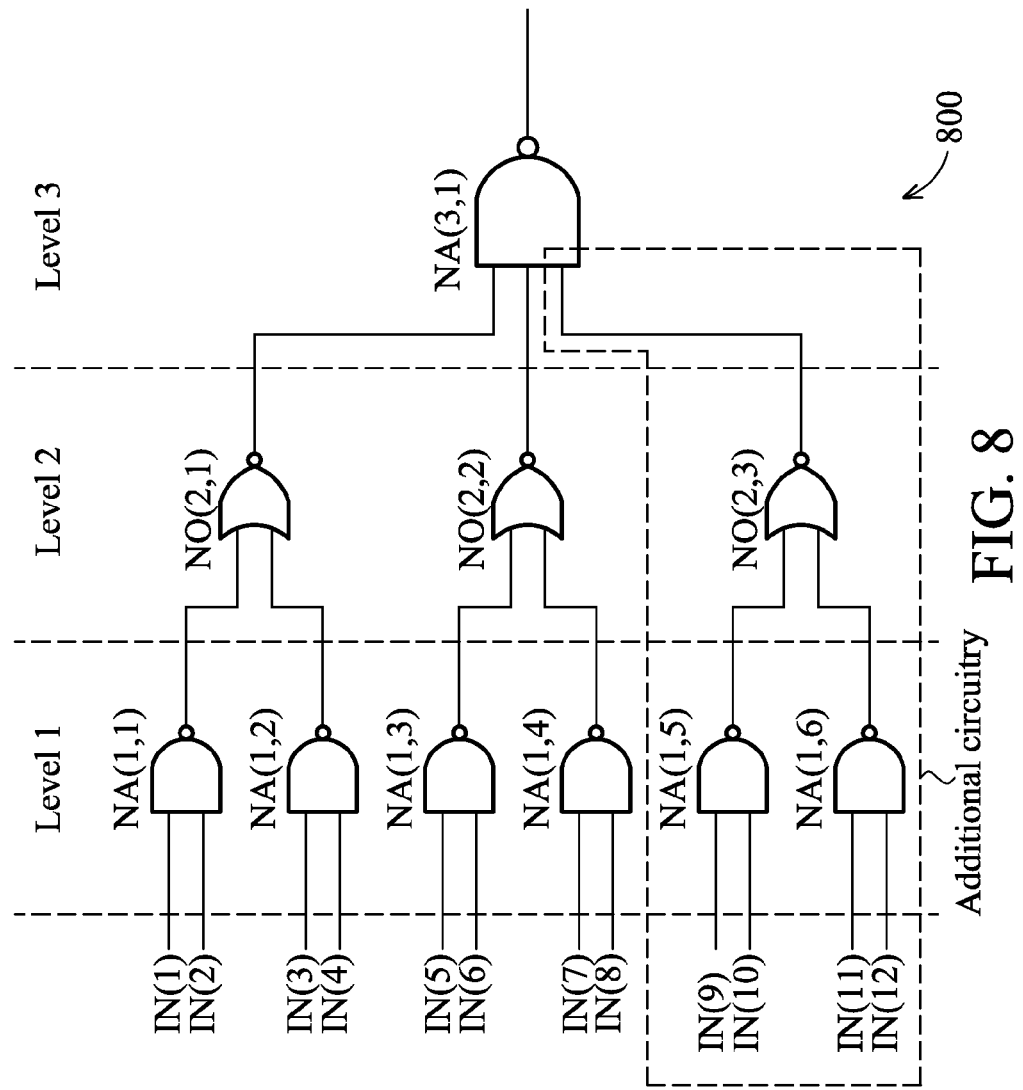
FIG. 8 shows the summary of FIG. 7 being modified to adapt to twelve inputs in accordance with an embodiment.

FIG. 8 shows a circuit 800 where index i of circuit 700 increases from eight to twelve. As a result, addition to circuit 700 includes four inputs IN(9) to IN(12), two NAND gates NA(1,5) and NA(1,6) at level one, one NOR gate NO(2,3) at level two. Further, NAND gate NA(3,1) at level three receives three instead of two inputs from the level two NOR gates.

Figure 9:
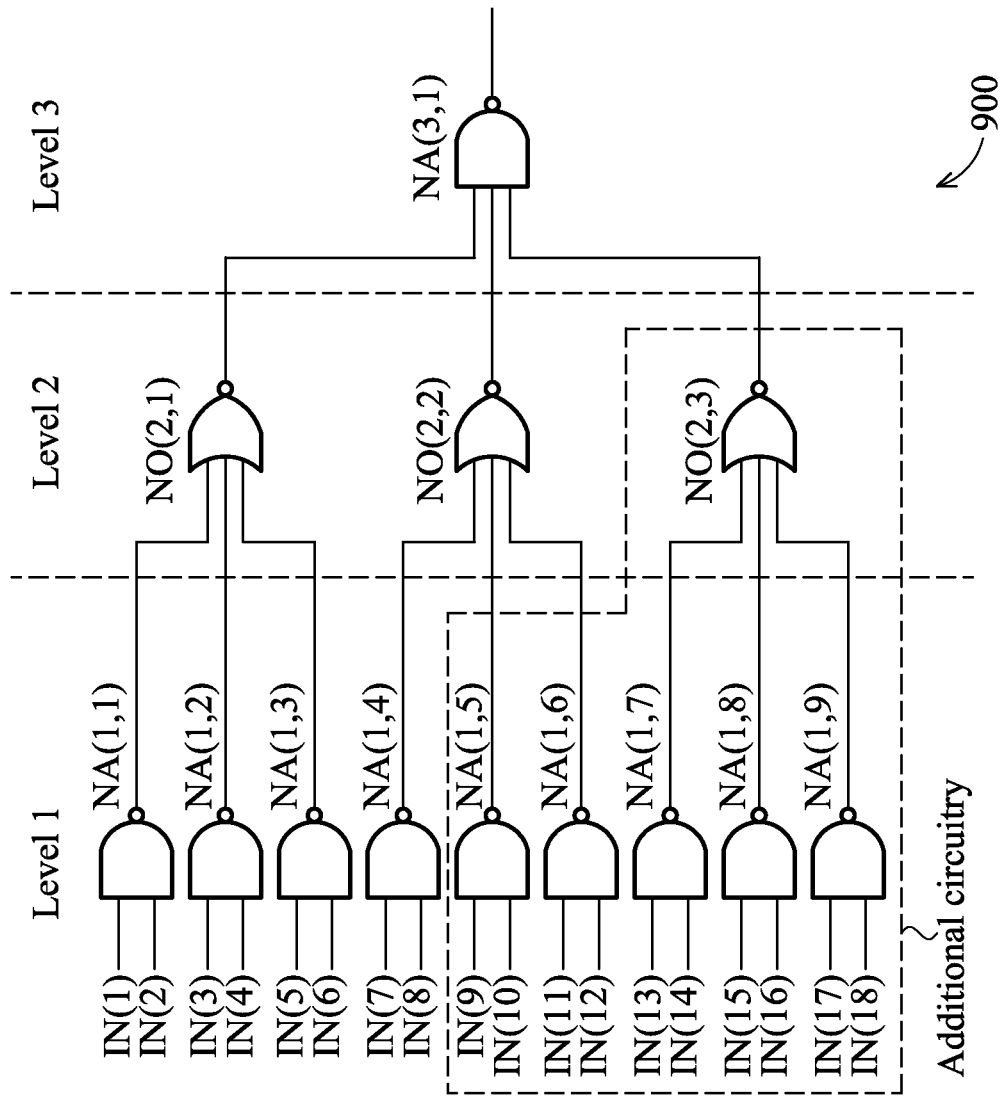
FIG. 9 shows the summary of FIG. 7 being modified to adapt to eighteen inputs in accordance with an embodiment.

FIG. 9 shows a circuit 900 where index i of circuit 700 increases from eight to eighteen. As a result, addition to circuit 800 includes ten inputs IN(9) to IN(18), one NOR gate NO(2,3) at level two. Further, NOR gates NO(2,1), NO(2,2) and the added NOR gate NO(2,3) each receives three inputs, instead of two. Additionally, NAND NA(3,1) at level three also receives three instead of two inputs from the level two NOR gates.

In various embodiments of the disclosure, when the number of outputs of NOR gates at level two increases, the number inputs of NAND gate NA(3,1) is increased to adapt to such increase of the NOR output. Depending on application, when this number of inputs is large to a point that NAND gate N(3,1) may be modified similar to the modification of summary S(1) as illustrated in FIGS. 6-9 to adapt to the increase in the number of inputs. That is, additional levels (e.g., level 4, level 5, level 6, etc.) may be added to circuits 700, 800, 900, etc., to perform the function of circuit 600. Adding levels (e.g., level 4, level 5, level 6, etc.) may be done similar to converting circuit 600 to circuits 700, 800, 900, etc. That is, converting a NAND gate with one level of logic gate to a NAND circuit with various levels of logic gates.

Figure 10:
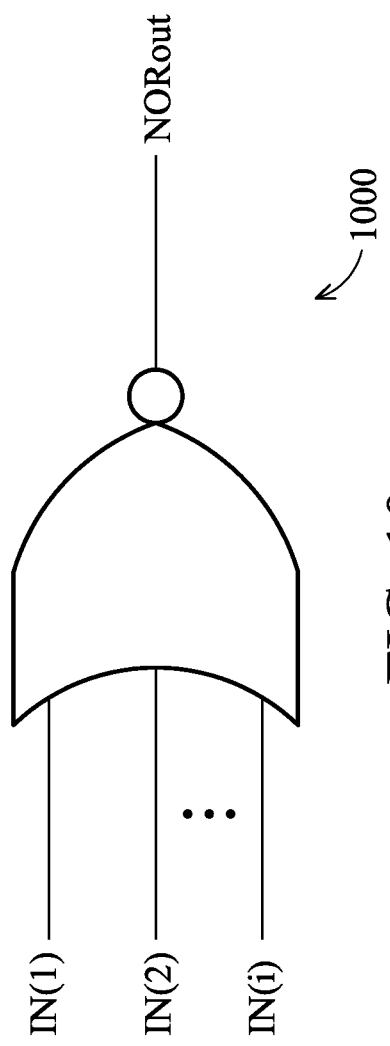
FIG. 10 shows a summary of the CAM in FIG. 1 as a NOR gate in accordance with an embodiment.
Figure 11:
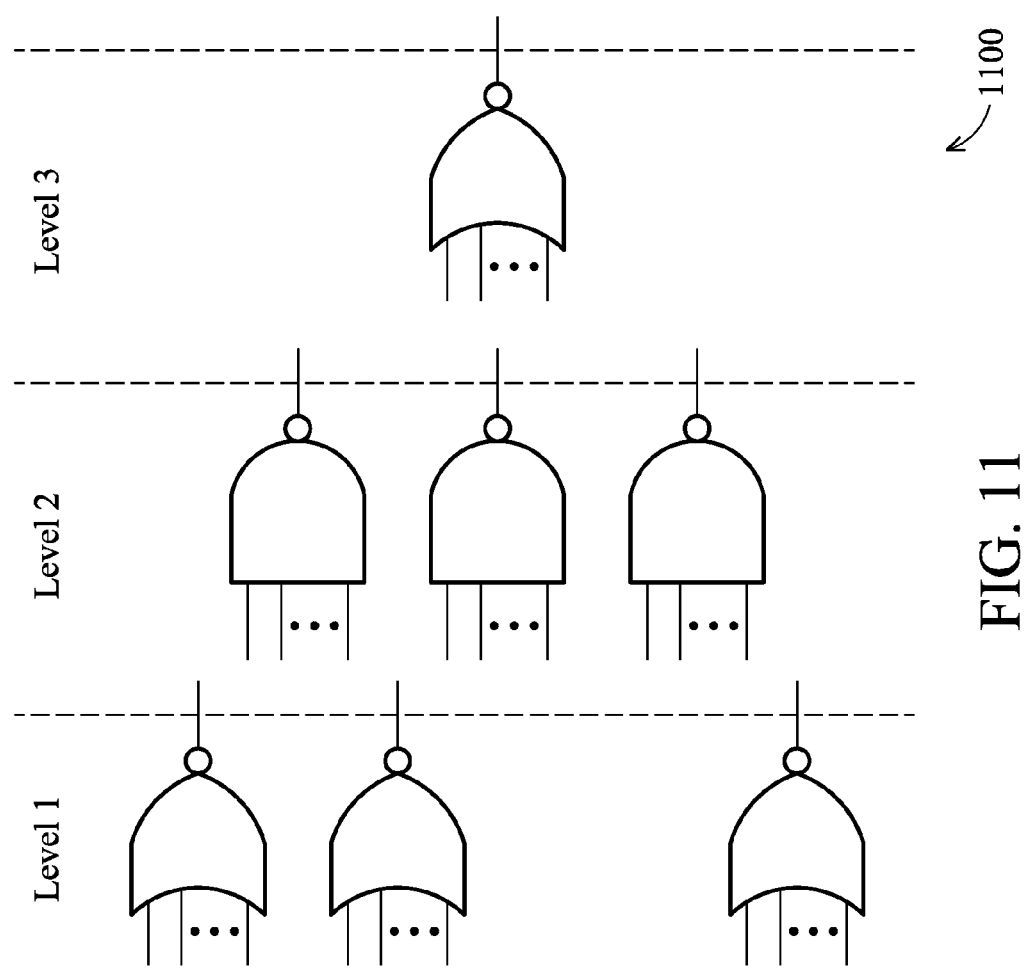
FIG. 11 shows the summary in FIG. 10 implemented in different levels of combinatorial circuitry in accordance with an embodiment.

FIG. 10 shows an embodiment of a Summary S (e.g., summary S(1)) implemented as a NOR gate 1000. NOR gate 1000 includes i number of inputs IN(1) to IN(i) and an output NORout, and corresponds to circuit 400 in the transistor level. FIG. 11 shows a NOR gate 1100 implemented with three levels of logic gates including a first level of NOR gate, a second level of NAND gate and a third level of NOR gate. The number of inputs to the logic gates in each level, the number of gates in each level, and the number of logic gate levels in NOR gate 1100 may vary in a manner similar to the NAND gate 600 as explained with respect to FIGS. 7, 8, and 9.

The Cam Cell

2nd Embodiment

Figure 12:
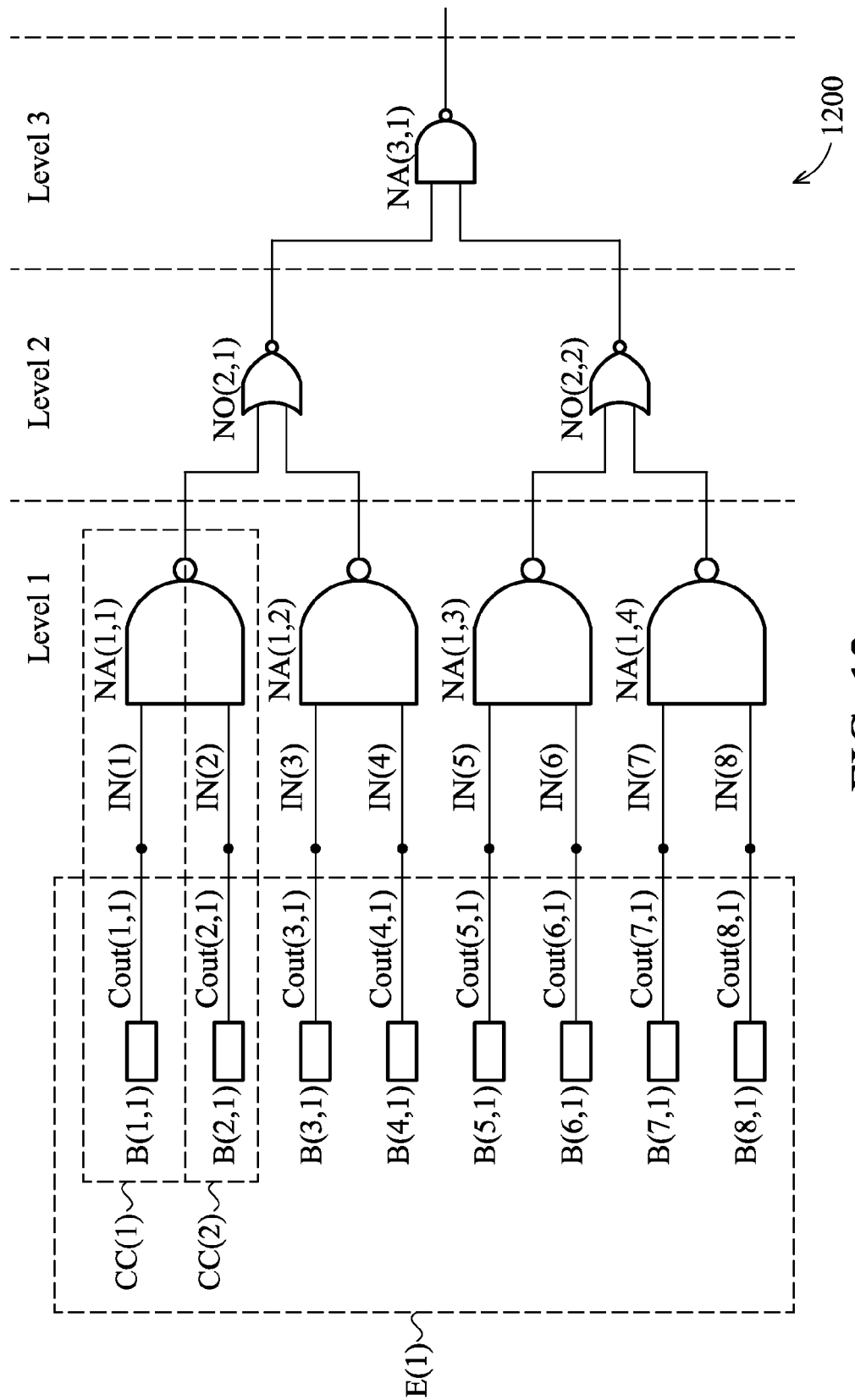
FIG. 12 shows a circuit to illustrate a second embodiment of CAM cells in accordance with an embodiment.

FIG. 12 shows a circuit 1200 illustrating CAM cells in accordance with a second embodiment of the disclosure. For illustration purposes, circuit 1200 shows an entry, e.g., entry E(1) associated with a data bus of eight data lines, e.g., data D(1) to D(8). In this embodiment, eight CAM cells B(1,1) to B(8,1) provide eight lines Cout(1,1) to Cout(8,1) to eight inputs IN(1) to IN(8) of a summary (e.g., summary S(1)) implemented as circuit 700. Further, a CAM cell B (e.g., B(1,1), B(2,1), B(3,1), etc.)) and half of the circuitry of a NAND gate in the first level (e.g., NAND NA(1,1), NA(1,2), NA(1,3), etc.) constitute a CAM cell CC. For simplicity, only two CAM cells CC(1) and CC(2) are shown. Further, if a NAND NA includes two N transistors and two P transistors as illustrated in FIG. 3, then a CAM cell CC (e.g., cell CC(1)) includes a CAM cell B (e.g., CAM cell B(1,1)) and circuitry associated with an N transistor (e.g., N(1)) and a P transistor (e.g., P(1)). Similarly, a CAM cell CC(2) includes a CAM cell B(2,1) and circuitry associated with N transistor N(2) and P transistor P(2), etc.

In various embodiments of the disclosure, a NAND NA in the first level receives two CAM cells CC, e.g., an odd CAM cell CC (e.g., CAM cells CC(1), CC(3), CC(5), etc.), and an even CAM cell CC (e.g., CAM cells CC(2), CC(4), CC(6), etc.) as inputs. For example, NAND NA(1,1) receives as inputs two CAM cells CC(1) and CC(2), NAND NA(1,2) receives as inputs two CAM cells CC(3) and CC(4), and NAND NA(1,3) receives as inputs two CAM cells CC(5) and CC(6), etc. FIG. 12 showing an eight input summary S is for illustration purposes only, if an entry E (e.g., E(1)) receives more than eight inputs, then each additional NAND in the first level (e.g., NAND NA(1,5), NA(1,6), NA(1,7), etc.) receives two additional CAM cells CC. Depending on applications, a NAND gate NA in the first level receiving two CAM cells CC as inputs provide consistency in terms of layout between output Cout of the comparator C and the NAND gate in the first level. It also provides efficient routing.

FIG. 12 shows a CAM cell CC including a CAM cell B and a half of the circuitry of a NAND NA for illustration purposes. If summary S(1,1) includes other gates (e.g., NOR gates) in the first level then a CAM cell CC includes a CAM cell B and half of the circuitry of that NOR gate.

Various embodiments of the disclosure are advantageous over other approaches because those approaches usually include a pre-charge circuit (e.g., transistor) to effect the voltage level of the match line (e.g., pulling down the match line level to ground) to determine whether there is a hit or a miss for an entry. Timing must be allocated for such discharges and corresponding charges. Further, in various situations, transistors for discharging and charging and transistors for the underlying inputs (e.g., data D) cannot be turned on at the same time. For example, one must be turned on after another one being turned off. Because various embodiments of the disclosure do not include pre-charge circuitry, timing for discharging and charging can be used for the underlying function of the circuit. The circuit can therefore operate at higher frequencies, and consequently perform its function in less time.

Layout Consideration

Various embodiments of the disclosure efficiently utilize layout slots as appropriate. For illustration purposes, a logic gate, e.g., a NAND in the first and third level, a NOR in the second and fourth level, etc., includes n number of inputs and one output. In various embodiments of the disclosure, where appropriate, n is selected to be odd (e.g., 1, 3, 5, etc.) so that the odd number of inputs n and the output constitute an even number. Alternatively expressed, where appropriate, various embodiments of the disclosure select a design such that a logic gate includes an even number of IO pins (input/output). By selecting the odd number of inputs (or an even number of input and output pins), layout slots in various embodiments of the disclosure are mostly used.

Figure 13:
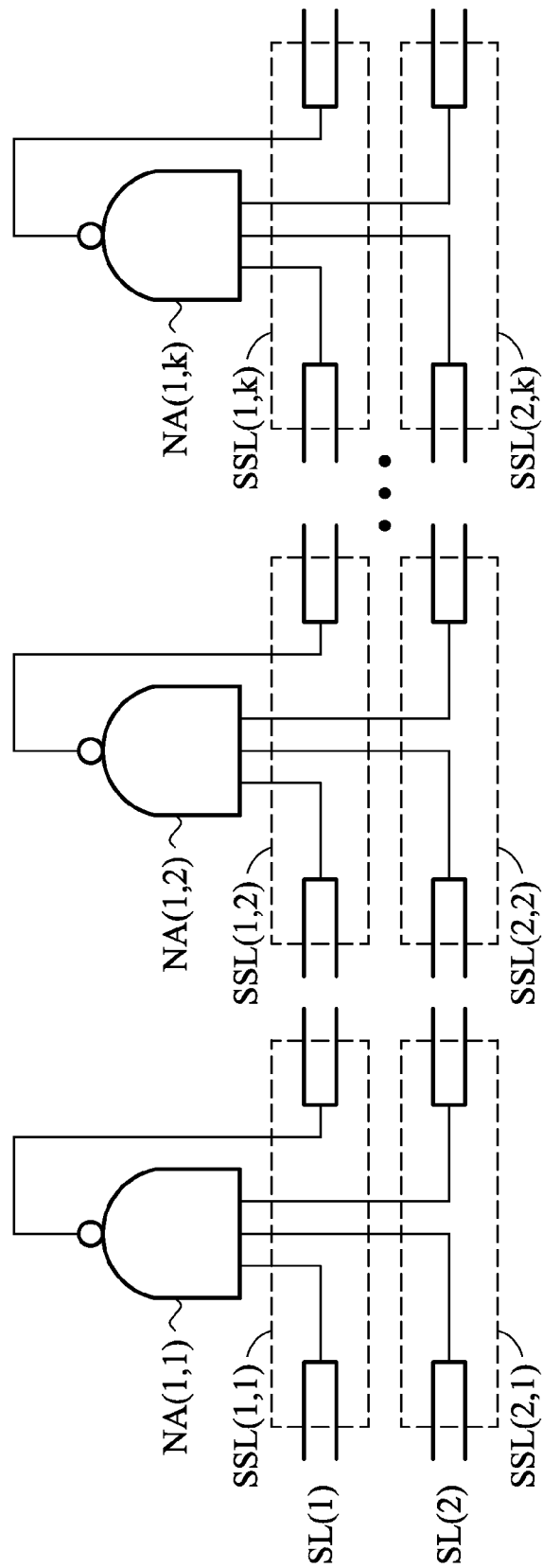
FIG. 13 shows an image to illustrate layouts in accordance with an embodiment.
Figure 14:
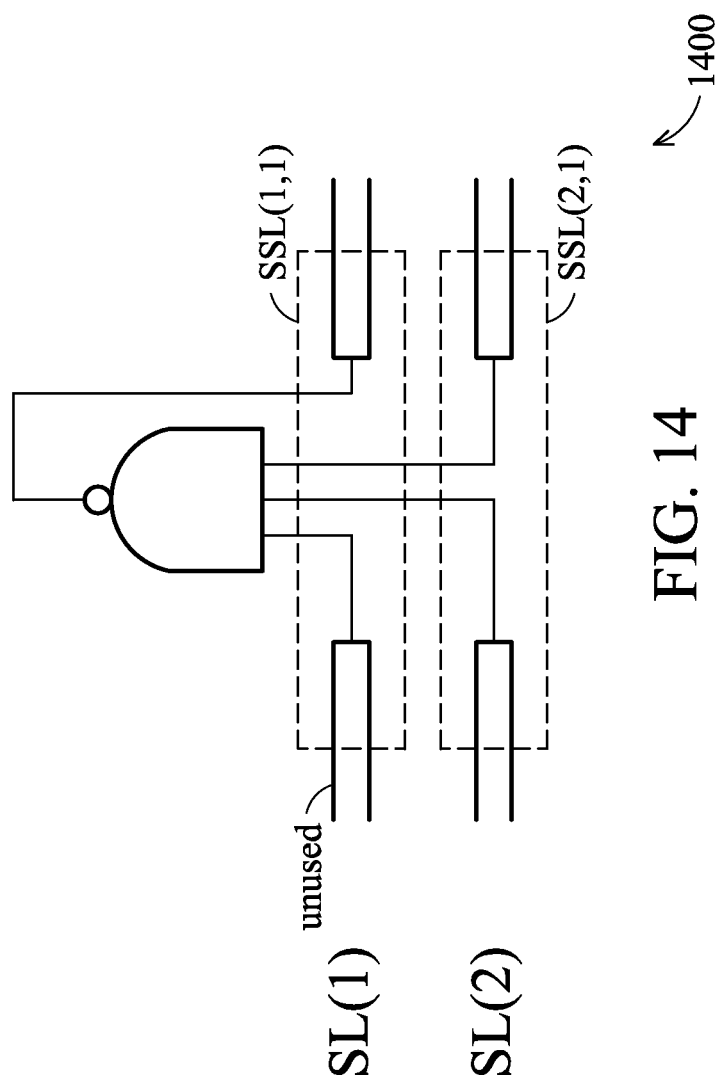
FIG. 14 shows an image to illustrate layouts disadvantaged over embodiments of the disclosure.

FIG. 13 shows an image 1300 in accordance with an embodiment of the disclosure. Image 1300 includes two slots SL(1) and SL(2). A slot SL includes a plurality of sub-slots each of which can adapt two pins, e.g., a pair of IO pins of a NAND NA. As a result, a NAND gate, e.g., NA(1,1) having four IO pins can utilize a sub slot SSL(1,1) of slot SL(1) and a sub slot SSL(2,1) of slot SSL(2). As shown, two inputs of each NAND gate NA use two pins of a same sub slot SSL of slot SL(1) while the third input and the output use two pins of the same sub slot SSL of SL(2). Because the number of IO pins of NAND NA is even, the layout slots are efficiently utilized. If the number of IO pins is odd, a sub slot SSL would not fully utilized. FIG. 14 shows a layout 1400 in which a NAND gate NA having two inputs and an output. The two inputs use a sub slot SSL(2,1) while output O uses a sub slot SSL(1,1). As shown, a portion of sub slot SSL(1,1) is unused and is therefore disadvantageous over various embodiments of the disclosure. Layout 1300 is shown to have two slots for illustration purposes only. Various embodiments of the disclosure are applicable with layouts having more than two slots SL. Additional slots SL are used for additional pins of the NAND NA. Generally, an additional slot SL is provided for each additional two IO pins of the NAND NA. For example, if a NAND NA includes six IO pins, then the additional two IO pins would use a sub slot of slot SL(3). If the NAND NA includes eight IO pins, then the additional four IO pins would use a sub slot of slot SL(3) and SL(4), etc.

A number of embodiments of the disclosure have been described. It will nevertheless be understood that various modifications may be made without departing from the spirit and scope of the invention. For example, various figures show a definite number for index i (e.g., i=2, FIG. 3; FIG. 5; i=8 FIG. 10; i=12, FIG. 8, etc.) for illustration purposes only, various embodiments of the disclosure are applicable with different values of index i when such index i operate to provide the functions consistent with the scope and spirit of the invention. FIGS. 7, 8, 9, 10, etc., show illustrative three levels of circuitry, but various embodiments are applicable with additional levels as long as the circuits with such additional levels can perform the equivalent functions of the underlying circuits and consistent with the spirit and scope of the invention. Some transistors are shown to be N-type and some others are shown to be P-type, but the disclosure is not limited to such a configuration because selecting a transistor type (e.g., NMOS or PMOS) is a matter of design choice based on need, convenience, etc. Various embodiments of the disclosure are applicable in variations and/or combinations of transistor types. Some signals are illustrated with a particular logic level to operate some transistors (e.g., activated high, deactivated low, etc.), but selecting such levels and the transistors are also a matter of design choice, and various embodiments of the disclosure are applicable in various design choices to maintain the spirit and scope of the invention as explained herein.

In accordance with an embodiment, a memory includes a plurality of content-addressable memory (CAM) cells and a summary circuit associated with the plurality of CAM cells. The summary circuit includes a first level of logic gates and a second level of logic gates. The first level of logic gates have inputs each configured to receive an output of a corresponding one of the plurality of CAM cell. The second level of logic gates have inputs each configured to receive an output of a corresponding one of the first level of logic gates.

In accordance with another embodiment, a content-addressable memory (CAM) includes a plurality of data lines, a plurality of CAM cells, and a summary circuit. Each of the plurality of CAM cells includes an output and is adapted to output a logic state on the output. The logic state on the output is based on a logic state of a respective data line associated with the respective CAM cell and data stored in the respective CAM cell. The summary circuit includes a plurality of logic gates and an output. The plurality of logic gates are configured to generate a logic state on the output of the summary circuit based on logic states of the outputs of the plurality of CAM cells. The plurality of logic gates are arranged as a plurality of levels of logic gates, and each logic gate of at least one level of the plurality level of logic gates comprises an output pin and an odd-number of input pins.

In accordance with another embodiment, a summary circuit includes a first level of logic gates and a second level of logic gates. The first level of logic gates have inputs each configured to receive an output of a corresponding one of a plurality of content-addressable memory (CAM) cells. The second level of logic gates have inputs each configured to receive an output of a corresponding one of the first level of logic gates. Each logic gate of the first level of logic gates, or each logic gate of the second level of logic gates, includes an even number of input/output pins.

Each claim of this document constitutes a separate embodiment, and embodiments that combine different claims and/or different embodiments are within the scope of the disclosure and will be apparent to those of ordinary skill in the art after reviewing this document.

What is claimed is:

1. A memory, comprising:
   a plurality of content-addressable memory (CAM) cells; and
   a summary circuit associated with the plurality of CAM cells, the summary circuit comprising:
      a first level of logic gates having inputs each configured to receive an output of a corresponding one of the plurality of CAM cells; and
      a second level of logic gates having inputs each configured to receive an output of a corresponding one of the first level of logic gates.

2. The memory of claim 1, wherein each logic gate of the first level of logic gates, or each logic gate of the second level of logic gates, comprises an even number of input/output pins.

3. The memory of claim 1, wherein each logic gate of the first level of logic gates, or each logic gate of the second level of logic gates, comprises an output pin and an odd-number of input pins.

4. The memory of claim 3, wherein the input pins and the output pins of the logic gates of the first level of logic gates are arranged according to a plurality of layout slots, each of the plurality of layout slots has a plurality of pairs of sub-slot pins, each pair of the plurality of pairs of sub-slot pins is associated with a corresponding one logic gate of the first level of logic gates, and each sub-slot pin is for a corresponding input or output pin of the first level of logic gates.

5. The memory of claim 3, wherein the input pins and the output pins of the logic gates of the second level of logic gates are arranged according to a plurality of layout slots, each of the plurality of layout slots has a plurality of pairs of sub-slot pins, each pair of the plurality of pairs of sub-slot pins is assigned to a corresponding one logic gate of the second level of logic gates, and each sub-slot pin is for a corresponding input or output pin of the second level of logic gates.

6. The memory of claim 1, wherein:
when the first level of logic gates are NAND gates, the second level of logic gates are NOR gates; and
when the first level of logic gates are NOR gates, the second level of logic gates are NAND gates.

7. The memory of claim 1, wherein the first level of logic gates are NAND gates and the second level of logic gates are NOR gates, and the memory further comprises one or more third level logic gates each configured to receive an output of a corresponding one of the second level of logic gates, and the one or more third level logic gates are NAND gates.

8. The memory of claim 1, wherein the first level of logic gates are NOR gates and the second level of logic gates are NAND gates, and the memory further comprises one or more third level logic gates each configured to receive an output of a corresponding one of the second level of logic gates, and the one or more third level logic gates are NOR gates.

9. A content-addressable memory (CAM) comprising:
a plurality of data lines;
a plurality of CAM cells, each of the plurality of CAM cells comprising an output and adapted to output a logic state on the output; the logic state on the output being based on a logic state of a respective data line associated with the respective CAM cell and data stored in the respective CAM cell; and
a summary circuit having a plurality of logic gates and an output, the plurality of logic gates are configured to generate a logic state on the output of the summary circuit based on logic states of the outputs of the plurality of CAM cells,
wherein the plurality of logic gates are arranged as a plurality of levels of logic gates, each logic gate of at least one level of the plurality of levels of logic gates comprises an output pin and an odd-number of input pins.

10. The CAM of claim 9, wherein the input pins and the output pins of the logicgates of the at least one level of the plurality of levels of logic gates are arranged according to a plurality of layout slots, each of the plurality of layout slots has a plurality of pairs of sub-slot pins, each pair of the plurality of pairs of sub-slot pins is associated with a corresponding one logic gate of the at least one level of the plurality of levels of logic gates, and each sub-slot pin is for a corresponding input or output pin of the at least one level of the plurality of levels of logic gates.

11. The CAM of claim 9, wherein the plurality of logic gates comprises:
a first level of logic gates having inputs each configured to receive a corresponding one of the outputs of the plurality of CAM cells; and
a second level of logic gates having inputs each configured to receive a corresponding one of the outputs of the first level of logic gates.

12. The CAM of claim 11, wherein:
when the first level of logic gates are NAND gates, the second level of logic gates are NOR gates; and
when the first level of logic gates are NOR gates, the second level of logic gates are NAND gates.

13. The CAM of claim 11, wherein the first level of logic gates are NAND gates and the second level of logic gates are NOR gates, and the plurality of logic gates further comprises one or more third level logic gates each configured to receive an output of a corresponding one of the second level of logic gates, and the one or more third level logic gates are NAND gates.

14. The CAM of claim 11, wherein the first level of logic gates are NOR gates and the second level of logic gates are NAND gates, and the plurality of logic gates further comprises one or more third level logic gates each configured to receive an output of a corresponding one of the second level of logic gates, and the one or more third level logic gates are NOR gates.

15. A summary circuit, comprising:
a first level of logic gates having inputs each configured to receive an output of a corresponding one of a plurality of content-addressable memory (CAM) cells; and
a second level of logic gates having inputs each configured to receive an output of a corresponding one of the first level of logic gates,
wherein each logic gate of the first level of logic gates, or each logic gate of the second level of logic gates, comprises an even number of input/output pins.

16. The summary circuit of claim 15, wherein the input/output pins of the logic gates of the first level of logic gates are arranged according to a plurality of layout slots, each of the plurality of layout slots has a plurality of pairs of sub-slot pins, each pair of the plurality of pairs of sub-slot pins is associated with a corresponding one logic gate of the first level of logic gates, and each sub-slot pin is for a corresponding input/output pin of the first level of logic gates.

17. The summary circuit of claim 15, wherein the input/output pins of the logic gates of the second level of logic gates are arranged according to a plurality of layout slots, each of the plurality of layout slots has a plurality of pairs of sub-slot pins, each pair of the plurality of pairs of sub-slot pins is assigned to a corresponding one logic gate of the second level of logic gates, and each sub-slot pin is for a corresponding input/output pin of the second level of logic gates.

18. The summary circuit of claim 15, wherein:
when the first level of logic gates are NAND gates, the second level of logic gates are NOR gates; and
when the first level of logic gates are NOR gates, the second level of logic gates are NAND gates.

19. The summary circuit of claim 15, wherein the first level of logic gates are NAND gates and the second level of logic gates are NOR gates, and the summary circuit further comprises one or more third level logic gates each configured to receive an output of a corresponding one of the second level of logic gates, and the one or more third level logic gates are NAND gates.

20. The summary circuit of claim 15, wherein the first level of logic gates are NOR gates and the second level of logic gates are NAND gates, and the summary circuit further comprises one or more third level logic gates each configured to receive an output of a corresponding one of the second level of logic gates, and the one or more third level logic gates are NOR gates.

* * * * *